(12) United States Patent
Vaupel et al.

(10) Patent No.: US 8,937,380 B1
(45) Date of Patent: Jan. 20, 2015

(54) DIE EDGE PROTECTION FOR PRESSURE SENSOR PACKAGES

(71) Applicant: Infineon Technologies AG, Neubiberg (DE)

(72) Inventors: Mathias Vaupel, Regensburg (DE); Uwe Fritzsche Schindler, Reichenbach (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/015,522

(22) Filed: Aug. 30, 2013

(51) Int. Cl.
  *H01L 23/02* (2006.01)
  *B81B 7/00* (2006.01)
  *B81C 1/00* (2006.01)

(52) U.S. Cl.
  CPC ........... *B81B 7/0032* (2013.01); *B81C 1/00261* (2013.01)
  USPC ........... 257/680; 257/676; 257/729; 257/787; 257/E23.002; 257/E23.135; 438/123; 438/124

(58) Field of Classification Search
  USPC ......... 257/666, 676, 678, 680, 729, 730, 787, 257/E23.002, E23.004, E23.135, E23.181, 257/E23.193, E23.194; 438/106, 123, 124
  See application file for complete search history.

(56) References Cited

U.S. PATENT DOCUMENTS

| | | | |
|---|---|---|---|
| 7,749,797 B2 * | 7/2010 | Bauer et al. | 438/64 |
| 8,729,697 B2 * | 5/2014 | Theuss et al. | 257/730 |

* cited by examiner

*Primary Examiner* — Eduardo A Rodela
(74) *Attorney, Agent, or Firm* — Murphy, Bilak & Homiller, PLLC

(57) ABSTRACT

A semiconductor package includes a lead spaced apart from a semiconductor die. The die includes a diaphragm disposed at a first side of the die and is configured to change an electrical parameter responsive to a pressure difference across the diaphragm. The die further includes a second side opposite the first side, a lateral edge extending between the first and second sides and a terminal at the first side. An electrical conductor connects the terminal to the lead. An encapsulant is disposed along the lateral edge of the die so that the terminal and the electrical conductor are spaced apart from the encapsulant. The encapsulant has an elastic modulus of less 10 MPa at room temperature. A molding compound covers and contacts the lead, the electrical conductor, the encapsulant, the terminal and part of the first side of the die so that the diaphragm is uncovered by the molding compound.

15 Claims, 7 Drawing Sheets

DIE EDGE PROTECTION FOR PRESSURE SENSOR PACKAGES

TECHNICAL FIELD

The present application relates to molded semiconductor packages, in particular molded pressure sensor packages.

BACKGROUND

Pressure sensor semiconductor dies include a diaphragm for sensing pressure. The sensed pressure is converted to an electrical parameter such as change in resistivity. Pressure sensor dies are typically encased in a molding compound to protect the connections to the die and the die itself from corrosion and other adverse effects. Molding compounds typically have an elastic modulus of greater than 1 GPa at room temperature and therefore are relatively hard. Conventional molded pressure sensor packages have a window in the molding compound over the diaphragm of the pressure sensor die so that the diaphragm is not covered by the molding compound.

Thermo-mechanical expansion of the molding compound imparts significant stress on the molded die, causing tension on the diaphragm even though the diaphragm is not covered by molding compound. The stress caused by the thermo-mechanical expansion of the molding compound can cause unacceptable variations in the pressure behavior of the sensor depending on the robustness of the membrane of the diaphragm. Some conventional pressure sensor packages include a glob top covering both the lateral side and top side of the die with the diaphragm in order to reduce this stress, by providing a softer buffer between the chip and the molding compound. However in this approach the glob top contacts the die terminals and part of the electrical connections between the die terminals and leads of the package. Glob top is a less effective barrier than molding compounds at blocking harmful chemicals such as $H_2SO_4$, etc., resulting in less component protection and early failure.

SUMMARY

According to an embodiment of a package, the package comprises a lead and a semiconductor die spaced apart from the lead. The die comprises a diaphragm disposed at a first side of the die. The die is configured to change an electrical parameter responsive to a pressure difference across the diaphragm. The die further comprises a second side opposite the first side, a lateral edge extending between the first and the second sides and a terminal at the first side of the die. An electrical conductor connects the terminal to the lead. An encapsulant is disposed along the lateral edge of the die so that the terminal and the electrical conductor are spaced apart from the encapsulant. The encapsulant has an elastic modulus of less 10 MPa at room temperature. A molding compound covers and contacts the lead, the electrical conductor, the encapsulant, the terminal and part of the first side of the die so that the diaphragm is uncovered by the molding compound.

According to an embodiment of a method of manufacturing a package, the method comprises: providing a lead and a semiconductor die spaced apart from the lead, the die comprising a diaphragm disposed at a first side of the die, the die configured to change an electrical parameter responsive to a pressure difference across the diaphragm, the die further comprising a second side opposite the first side, a lateral edge extending between the first and the second sides and a terminal at the first side of the die; connecting the terminal to the lead via an electrical conductor; disposing an encapsulant along the lateral edge of the die so that the terminal and the electrical conductor are spaced apart from the encapsulant, the encapsulant having an elastic modulus of less 10 MPa at room temperature; and covering and contacting the lead, the electrical conductor, the encapsulant, the terminal and part of the first side of the die with a molding compound so that the diaphragm is uncovered by the molding compound.

According to another embodiment of a package, the package comprises a lead and a semiconductor die spaced apart from the lead. The die comprises a diaphragm disposed at a first side of the die. The die is configured to change an electrical parameter responsive to a pressure difference across the diaphragm. The die further comprises a second side opposite the first side, a lateral edge extending between the first and the second sides and a terminal at the first side of the die. An electrical conductor connects the terminal to the lead. A glob top is disposed only along the lateral edge of the die and has an elastic modulus of less 10 MPa at room temperature. A molding compound covers and contacts the lead, the electrical conductor, the encapsulant, the terminal and part of the first side of the die so that the diaphragm is uncovered by the molding compound. The molding compound has an elastic modulus of greater than 1 GPa at room temperature.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 3, which includes

FIG. 4, which includes

DETAILED DESCRIPTION

The embodiments described herein provide a stress-relief mechanism for molded pressure sensor packages. An encapsulant is disposed along the lateral edge of a pressure sensor die included in the package, so that terminals of the die and electrical conductors connected to the terminals are spaced apart from the encapsulant. The encapsulant has an elastic modulus of less 10 MPa at room temperature, and therefore is significantly softer than the molding compound used to encase the die and interconnects. The encapsulant acts as a resilient buffer between the lateral edge of the pressure sensor die and the molding compound. A cavity is provided in the molding compound so that the diaphragm of the pressure sensor die is uncovered by the molding compound.

Figure 1:
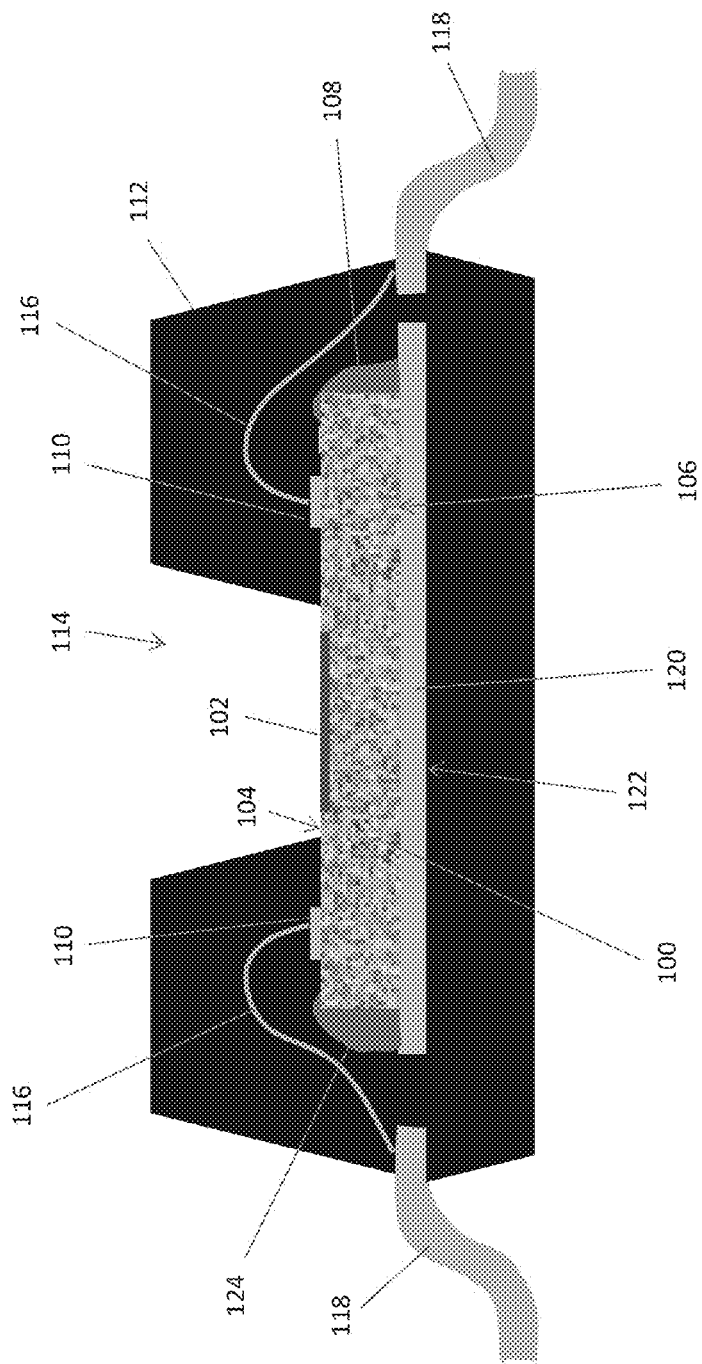
FIG. 1 illustrates a cross-sectional view of an embodiment of a molded package including an encapsulant along the lateral edge of a pressure sensor die.

FIG. 1 illustrates a cross-sectional view of an embodiment of a package including a pressure sensor semiconductor die 100. The die 100 comprises a diaphragm 102 disposed at a top side 104 of the die 100. The die 100 is configured to change an electrical parameter such as resistivity responsive to a pressure difference across the diaphragm 102. For example, measurement of pressure with a silicon sensor die is based on the piezo-resistive effect. This is utilized in a silicon diaphragm in which mechanical stress leads to a change of resistivity. The mechanical stress results from a pressure difference across the diaphragm. A network of implanted resistors in the diaphragm can be used to transform the change of resistivity into an electrical signal that is proportional to the applied pressure difference. Depending on the application, the sensor can be used as a bare die or be bonded to glass for mechanical restraint or to provide a reference vacuum.

The pressure sensor die 100 further comprises a bottom side 106 opposite the top side 104, a lateral edge 108 extending between the top and bottom sides 104, 106 and at least one terminal 110 at the top side 104 of the die 100. The die 100 is encased in a molding compound 112 to protect the die 100 and the die terminals 110 from corrosion and other adverse effects. A cavity 114 is provided in the molding compound 112 over the diaphragm 102 to ensure that the molding compound 112 does not interfere with operation of the diaphragm 102. The cavity 114 can be formed in the molding compound 112 using any suitable standard processing such as film-assisted molding in which an insert (not shown) is positioned over the diaphragm 102 in the injection mold. The insert is removed after molding, yielding the cavity 114 in the molding compound 112. Any standard molding compound used in semiconductor packages and having an elastic modulus of greater than 1 GPa at room temperature can be used to encase the pressure sensor die 100 and the electrical connections provided to the terminals 110 of the die 100.

The electrical connections to the die terminals 110 can be realized by bond wires, bond ribbons, metal clips, or any other type of suitable electrical conductor 116. One end of each electrical conductor 116 is connected to a terminal 110 of the die 100 and the opposite end is connected to a corresponding lead 118 of the package. These connections can be formed by soldering, gluing, ultrasonic bonding, etc. The leads 118 are spaced apart from the pressure sensor die 100 and partly encased by the molding compound 112 so that the leads 118 protrude from the molding compound 112 to provide points of external electrical connection to the pressure sensor die 100.

The pressure sensor die 100 can be attached to a support substrate 120 such as a die paddle of a lead frame or a ceramic material. The back side 122 of the support substrate 120 can be exposed to provide a thermal and/or electrical pathway to the pressure sensor die 100. For example in the case of a vertical die 100, current flows through the semiconductor material between the front and back sides 104, 106 of the die 100. The support substrate 120 can be electrically conductive (e.g. a copper block) in this case to provide an electrical pathway to the back side 106 of the die 100. In the case of a lateral die 100, current flows through the semiconductor material near the front side 104 of the die 100 between the terminals 110 at the front side 104. The support substrate 120 can be thermally conductive (e.g. ceramic) in this case to provide a thermal pathway to the back side 106 of the die 100.

In each case, an encapsulant 124 is disposed along the lateral edge 109 of the pressure sensor die 100. In one embodiment, the encapsulant 124 is an epoxy such as a glob top. Standard epoxies used in semiconductor packages can be dispensed by syringe, or stencil or screen printing. Glob tops provide some protection from contaminants, facilitate thermal dissipation and minimize thermal mismatch between the die 100 and support substrate 120 on which the die 100 is attached. In addition, glob tops provide dielectric insulation for the circuit as well as mechanical support. Other types of epoxies can be used as the encapsulant 124 so long as the encapsulant 124 has an elastic modulus of less 10 MPa at room temperature, which is significantly lower than the elastic modulus of the molding compound 112. The encapsulant 124 can extend slightly onto the outermost perimeter of the top side 104 of the pressure sensor die 100 as shown in FIG. 1, but is spaced apart from each terminal 110 at the top side 104 of the die 100 and each electrical conductor 116 connected to the lead(s) 110. This way, the molding compound 112 and not the encapsulant 124 contacts the die terminals 110 and the electrical conductors 116 included in the package.

The softer encapsulant 124 acts as a resilient buffer between the lateral edge 108 of the pressure sensor die 100 and the harder molding compound 112 over a wide temperature range e.g. −40° C. to 110° C. Disposing the encapsulant 124 along the lateral edge 108 of the pressure sensor die 100 yields slightly higher thermo-mechanical stress on the die 100 as compared to providing glob top on both the lateral edge 108 and top side 104 of the die 100, however the encapsulant 124 does not contact the die terminals 110 or any part of the electrical conductors 116 connected to the die terminals 110 when disposed only along the lateral edge 108 of the die 100. This configuration ensures that the molding compound 112 covers and contacts the leads 118, electrical conductors 116 and encapsulant 124, the harder molding compound 112 being a more effective barrier against corrosion and other related adverse effects as compared to the softer encapsulant 124. As such, a highly robust molded pressure sensor package with low thermo-mechanical stress and good corrosion barrier properties is provided.

Figure 2:
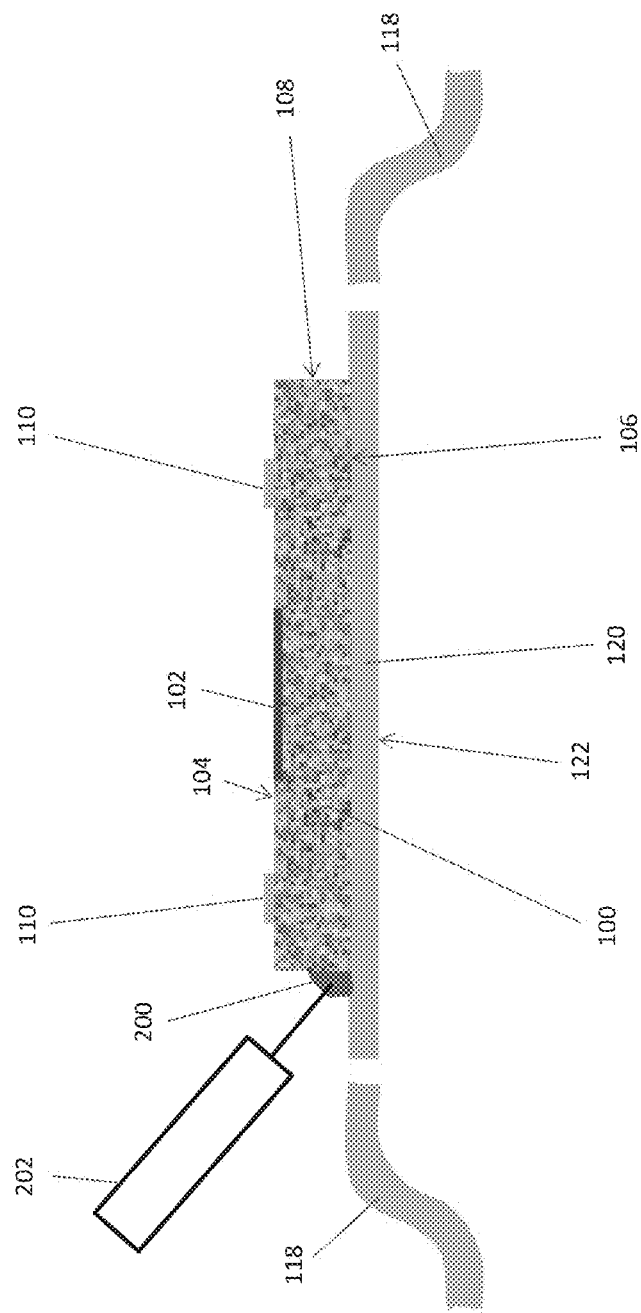
FIG. 2 illustrates a cross-sectional view of an embodiment of a molded package during application of an epoxy encapsulant along the lateral edge of a pressure sensor die and prior to molding.

FIG. 2 illustrates a cross-sectional view of the package prior to molding. According to this embodiment, the encapsulant 124 is a glob top epoxy 200. The glob top epoxy 200 is disposed along the lateral edge 108 of the die 100 by moving a syringe 202 along the lateral edge 108 of the die 100 and dispensing the glob top epoxy 200 through the syringe 202. The epoxy 202 is then cured to form the glob top-based encapsulant 124. The glob top-based encapsulant 124 can extend slightly onto the outermost perimeter of the top side 104 of the die 100 e.g. as shown in FIG. 1, but is spaced apart from each terminal 110 at the top side 104 of the die 100 and each corresponding electrical conductor 116 subsequently connected to the terminal(s) 110.

Figure 3A:
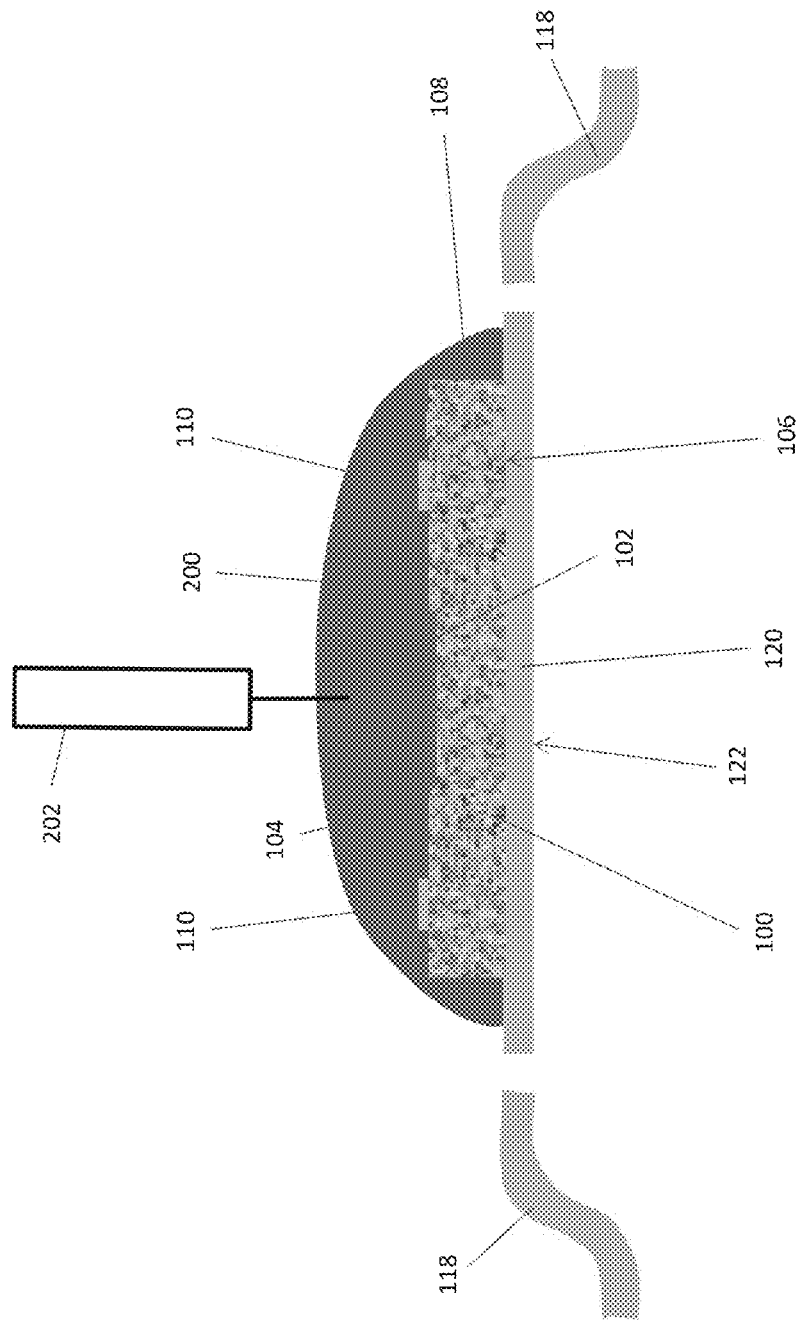
FIGS. 3A and 3B, illustrates a cross-sectional view of an embodiment of a molded package during different stages of applying an epoxy encapsulant along the lateral edge of a pressure sensor die and prior to molding.
Figure 3B:
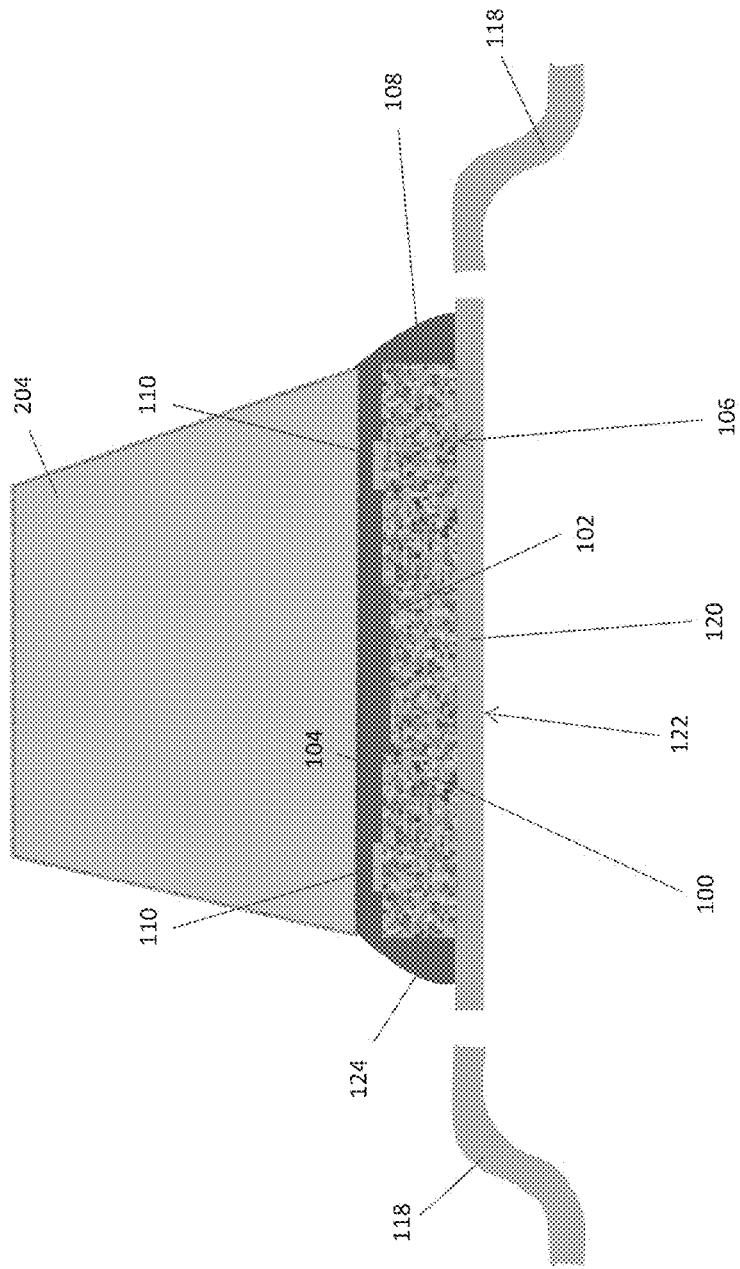

FIG. 3, which includes FIGS. 3A and 3B, illustrates a cross-sectional view of the package during different stages of the glob top epoxy process according to another embodiment. In FIG. 3A, a syringe 202 is used to globally dispense a glob top epoxy 200 on the top side 104 and the lateral edge 108 of the pressure sensor die 100. The glob top epoxy 200 is then cured to form the glob top-based encapsulant 124. The glob top-based encapsulant 124 is removed from the top side 104 of the pressure sensor die 100 via a plasma process 204. FIG. 3B shows the glob top-based encapsulant 124 during the plasma process 204, prior to completion. As with the previous embodiments described herein, the glob top-based encapsulant 124 can extend slightly onto the outermost perimeter of the top side 104 of the die 100 after completion of the plasma process 200 e.g. as shown in FIG. 1 but is spaced apart from each terminal 110 at the top side 104 of the pressure sensor die 100 and each corresponding electrical conductor 116 subsequently connected to the terminal(s) 110.

Figure 4A:
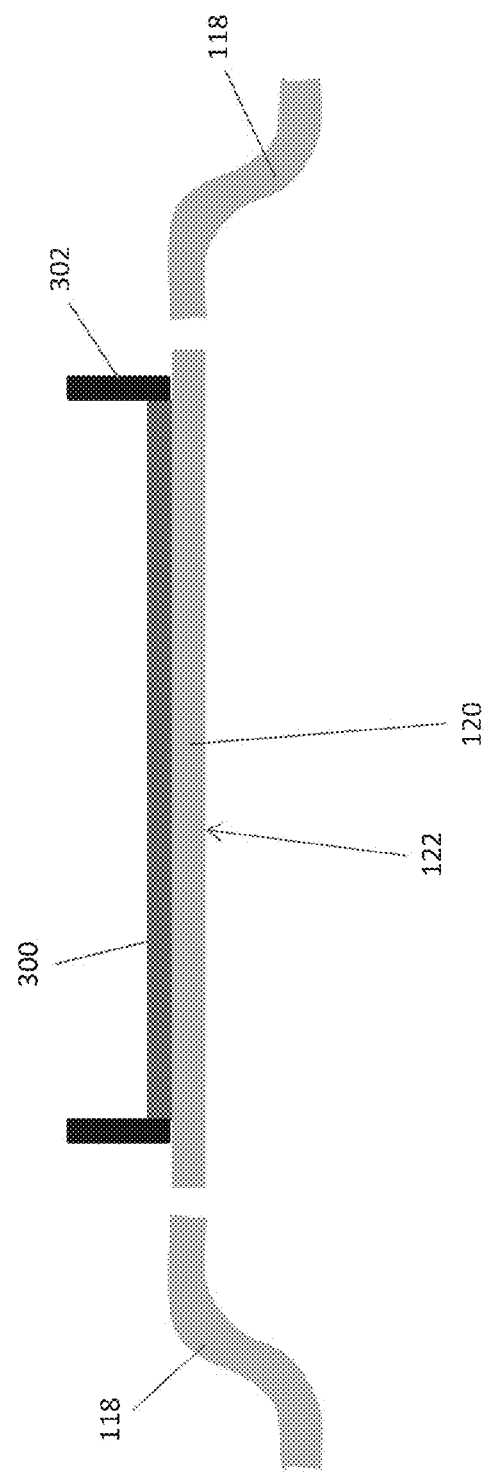
FIGS. 4A and 4B, illustrates a cross-sectional view of another embodiment of a molded package during different stages of applying an epoxy encapsulant along the lateral edge of a pressure sensor die and prior to molding.
Figure 4B:
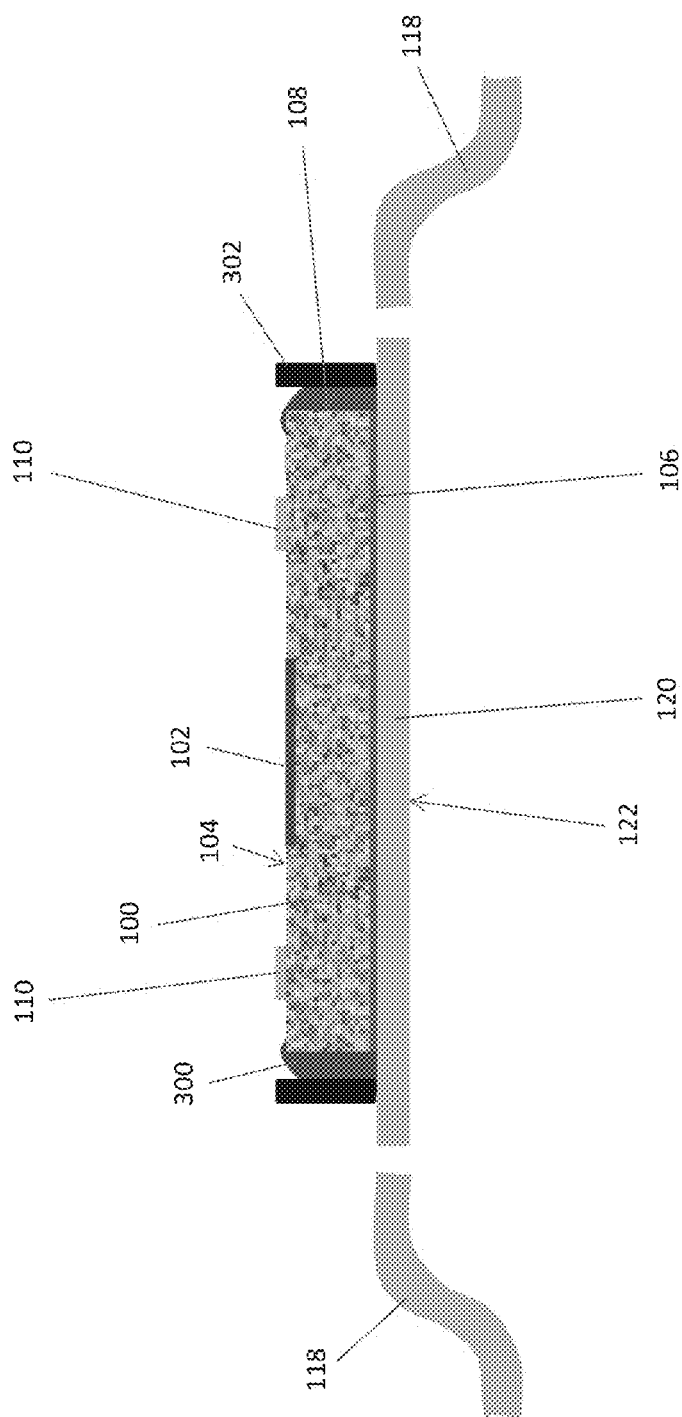

FIG. 4, which includes FIGS. 4A and 4B, illustrates a cross-sectional view of the package during different stages of another embodiment of disposing the encapsulant 124 along the lateral edge 108 of the pressure sensor die 100. According to this embodiment, an adhesive 300 is applied to a support substrate 120 such as a die paddle of a lead frame or a ceramic material as shown in FIG. 4A. The adhesive 300 can be electrically conductive or insulating. An optional dam 302 can be provided for containing the adhesive 300. The pressure sensor die 100 is then pressed into the adhesive 300 at the bottom side 106 of the die 100 so that some of the adhesive 300 is forced out from under the die 100 and onto the lateral edge 108 of the die 100 as shown in FIG. 4B. The optional dam 302 aids in guiding the adhesive 300 along the lateral edge 108 of the pressure sensor die 100. The adhesive 300 can extend slightly onto the outermost perimeter of the top side 104 of the pressure sensor die 100 as shown in FIG. 4B, but is spaced apart from each terminal 110 at the top side 104 of the die 100 and each corresponding electrical conductor 116 subsequently connected to the terminal(s) 110. The adhesive 300 is eventually cured to form the encapsulant 124.

Figure 5:
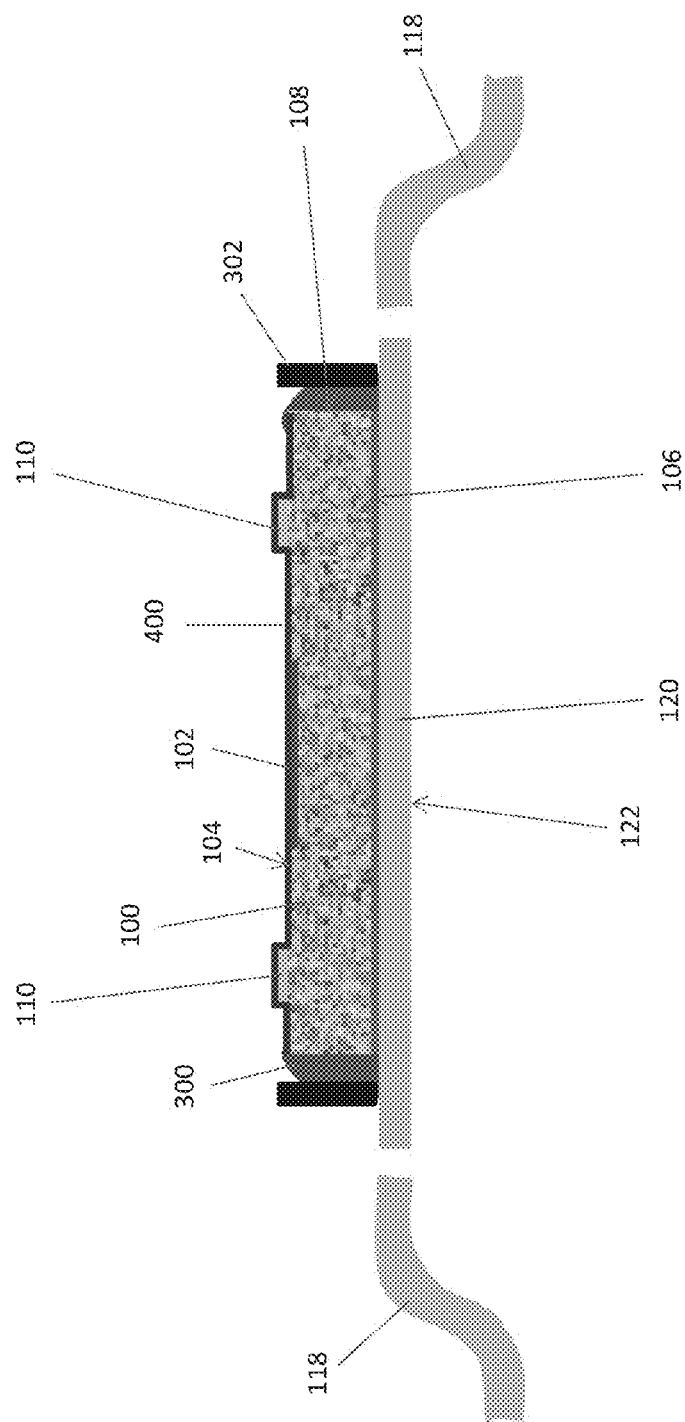
FIG. 5 illustrates a cross-sectional view of yet another embodiment of a molded package during application of an epoxy encapsulant along the lateral edge of a pressure sensor die and prior to molding.

FIG. 5 illustrates a cross-sectional view of the package prior to molding, according to yet another embodiment. The embodiment shown in FIG. 5 is similar to the embodiment shown in FIG. 4, however, a resist 400 is applied to the top side 104 of the pressure sensor die 100 prior to pressing the die 100 into the adhesive 300. Any standard resist 400 can be used so long as the resist 300 can be removed selective to the adhesive 300. The resist 400 is removed after the pressure sensor die 100 is secured to the support substrate 120 by the adhesive 300. The resist 400 is removed selective to the adhesive 300 so that the adhesive 300 remains on the bottom side 106 and lateral edge 108 of the die 100 after removal of the resist 400. The adhesive 300 is completely removed from the top side 104 of the die 100 according to this embodiment.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A package, comprising:
a lead;
a semiconductor die spaced apart from the lead and comprising a diaphragm disposed at a first side of the die, the die configured to change an electrical parameter responsive to a pressure difference across the diaphragm, the die further comprising a second side opposite the first side, a lateral edge extending between the first and the second sides and a terminal at the first side of the die;
an electrical conductor connecting the terminal to the lead;
an encapsulant disposed along the lateral edge of the die so that the terminal and the electrical conductor are spaced apart from the encapsulant, the encapsulant having an elastic modulus of less 10 MPa at room temperature; and
a molding compound covering and contacting the lead, the electrical conductor, the encapsulant, the terminal and part of the first side of the die so that the diaphragm is uncovered by the molding compound.

2. The package of claim 1, wherein the encapsulant is an epoxy.

3. The package of claim 2, wherein the epoxy is a glob top.

4. The package of claim 1, wherein the encapsulant is an adhesive attaching the second side of the die to a support substrate, the adhesive covering the second side and the lateral edge of the die.

5. The package of claim 4, wherein the support substrate is a die paddle of a lead frame.

6. A method of manufacturing a package, the method comprising:
providing a lead and a semiconductor die spaced apart from the lead, the die comprising a diaphragm disposed at a first side of the die, the die configured to change an electrical parameter responsive to a pressure difference across the diaphragm, the die further comprising a second side opposite the first side, a lateral edge extending between the first and the second sides and a terminal at the first side of the die;
connecting the terminal to the lead via an electrical conductor;
disposing an encapsulant along the lateral edge of the die so that the terminal and the electrical conductor are spaced apart from the encapsulant, the encapsulant having an elastic modulus of less 10 MPa at room temperature; and
covering and contacting the lead, the electrical conductor, the encapsulant, the terminal and part of the first side of the die with a molding compound so that the diaphragm is uncovered by the molding compound.

7. The method of claim 6, wherein disposing the encapsulant along the lateral edge of the die comprises disposing an epoxy along the lateral edge of the die.

8. The method of claim 7, wherein disposing the epoxy along the lateral edge of the die comprises disposing a glob top along the lateral edge of the die.

9. The method of claim 8, wherein disposing the glob top along the lateral edge of the die comprises:
moving a syringe along the lateral edge of the die;
dispensing an epoxy through the syringe; and
curing the epoxy to form the glob top.

10. The method of claim 8, wherein disposing the glob top along the lateral edge of the die comprises:
covering the first side and the lateral edge of the die with the glob top; and
removing the glob top from the first side of the die via a plasma process.

11. The method of claim 6, wherein disposing the encapsulant along the lateral edge of the die comprises:
applying an adhesive to a support substrate; and pressing the die into the adhesive at the second side of the die so that some of the adhesive is forced out from under the die and onto the lateral edge of the die.

12. The method of claim 11, further comprising:
applying a resist onto the first side of the die prior to pressing the die into the adhesive, the resist being removable selective to the adhesive; and
removing the resist after the die is secured to the support substrate by the adhesive, the resist being removed selective to the adhesive so that the adhesive remains on the second side and lateral edge of the die after removal of the resist.

13. The method of claim 11, wherein the support substrate is a die paddle of a lead frame.

14. The method of claim 6, wherein the encapsulant is disposed along the lateral edge of the die by printing.

15. A package, comprising:
a lead;
a semiconductor die spaced apart from the lead and comprising a diaphragm disposed at a first side of the die, the die configured to change an electrical parameter responsive to a pressure difference across the diaphragm, the die further comprising a second side opposite the first side, a lateral edge extending between the first and the second sides and a terminal at the first side of the die;
an electrical conductor connecting the terminal to the lead;
a glob top disposed only along the lateral edge of the die and having an elastic modulus of less 10 MPa at room temperature; and
a molding compound covering and contacting the lead, the electrical conductor, the encapsulant, the terminal and part of the first side of the die so that the diaphragm is uncovered by the molding compound, the molding compound having an elastic modulus of greater than 1 GPa at room temperature.

\* \* \* \* \*